(12) United States Patent
Albrecht et al.

(10) Patent No.: US 7,236,324 B2
(45) Date of Patent: Jun. 26, 2007

(54) APPARATUS, METHOD AND SYSTEM FOR FABRICATING SERVO PATTERNS ON HIGH DENSITY PATTERNED MEDIA

(75) Inventors: Thomas Robert Albrecht, San Jose, CA (US); Zvonimir Z. Bandic, San Jose, CA (US)

(73) Assignee: Hitachi Global Storage Technologies, Amsterdam (NL)

( * ) Notice: Subject to any disclaimer, the term of this patent is extended or adjusted under 35 U.S.C. 154(b) by 0 days.

(21) Appl. No.: 11/252,457

(22) Filed: Oct. 18, 2005

(65) Prior Publication Data

US 2007/0092650 A1 Apr. 26, 2007

(51) Int. Cl.
*G11B 21/02* (2006.01)
*G11B 5/596* (2006.01)

(52) U.S. Cl. .................. 360/75; 428/826; 427/127; 360/77.08

(58) Field of Classification Search ............ None
See application file for complete search history.

(56) References Cited

U.S. PATENT DOCUMENTS 4,321,282 A 3/1982 Johnson
4,776,938 A 10/1988 Abe et al.
4,935,278 A 6/1990 Krounbi et al.

(Continued)

FOREIGN PATENT DOCUMENTS

JP 2042723 2/1990

(Continued)

OTHER PUBLICATIONS

S. Landis et al.,"Realization and characterization of magnetic media deposited on side edge of patterned silicon dot arrays," Microprocesses and Nanotechnology Conference, 2003. Digest of Papers. 2003 International, pp. 60-61.

(Continued)

*Primary Examiner*—Andrew L. Sniezek
(74) *Attorney, Agent, or Firm*—Kunzler & McKenzie

(57) ABSTRACT

An apparatus, system, and method are disclosed for utilizing a "shadow mask" approach to fabricate servo patterns on high density patterned media. The apparatus may include a deposition mask having a plurality of apertures generated by a conventional lithographic process. Material may be deposited onto a substrate through the deposition mask apertures from at least one deposition source oriented at unique deposition angles. In this manner, each aperture may correspond to multiple deposition locations. Apertures may be precisely dimensioned and positioned to create servo pattern features from the resulting deposition locations. The deposition mask may also include a plurality of bit pattern apertures adapted to direct a material to a plurality of deposition locations on the substrate, the deposition locations forming a bit pattern concurrent with formation of a servo pattern.

32 Claims, 19 Drawing Sheets

U.S. PATENT DOCUMENTS

| | | |
|---|---|---|
| 5,185,055 A | 2/1993 | Temple et al. |
| 6,042,998 A | 3/2000 | Brueck et al. |
| 6,313,905 B1 | 11/2001 | Brugger et al. |
| 6,411,459 B1 | 6/2002 | Belser et al. |
| 6,420,058 B1 | 7/2002 | Haratani et al. |
| 6,451,508 B1 | 9/2002 | Bukofsky et al. |
| 6,511,791 B1 | 1/2003 | Bukofsky et al. |
| 6,719,841 B2 | 4/2004 | Chen et al. |
| 6,846,517 B2 * | 1/2005 | Chang et al. ............... 427/282 |
| 2003/0008099 A1 | 1/2003 | Nishikawa et al. |
| 2003/0113524 A1* | 6/2003 | Klemmer et al. ........... 428/209 |
| 2004/0101713 A1 | 5/2004 | Wachenschwanz et al. |
| 2004/0127012 A1 | 7/2004 | Jin |
| 2004/0150311 A1 | 8/2004 | Jin |
| 2004/0151947 A1 | 8/2004 | Rodmacq et al. |
| 2004/0156108 A1 | 8/2004 | Chou et al. |
| 2005/0248873 A1* | 11/2005 | Coker et al. .................. 360/75 |

FOREIGN PATENT DOCUMENTS

JP 4176021 6/1992

OTHER PUBLICATIONS

S.E. Lamber, "Beyond discrete tracks: Other aspects of patterned media," J. Appl. Phys.69 (8), Apr. 15, 1991, pp. 4724-4726.

"Magnetically Discrete but Physically continuous Recording Tracks," IBM Technical Disclosure Bulletin, Oct. 1975, p. 1641-1642.

Gyuman Kim, et al., Photoplastic Shadow-Masks for Rapid Resistless Multi-Layer Micropatterning, The 11$^{th}$ International Conference on Soild-State Sensors and Actuators, Munich Germany, Jun. 10-14, 200, p. 1632-1635.

Roli Lüthi, et al., Parallel Nanodevice Fabrication Using a Combination of Shadow Mask and Scanning Probe Methods, Applied Physics Letters vol. 75, No. 9, p. 1314-1316.

* cited by examiner

APPARATUS, METHOD AND SYSTEM FOR FABRICATING SERVO PATTERNS ON HIGH DENSITY PATTERNED MEDIA

BACKGROUND OF THE INVENTION

1. Field of the Invention

This invention relates to an apparatus, method and system for defining a pattern on a substrate and more particularly relates to an apparatus, method and system for fabricating servo patterns on high density patterned media.

2. Description of the Related Art

Hard-disk drives provide data storage for data processing systems in computers and servers, and are becoming increasingly pervasive in media players, digital recorders, and other personal devices. Advances in hard-disk drive technology have made it possible for a user to store an immense amount of digital information on an increasingly small disk, and to selectively retrieve and alter portions of such information almost instantaneously. Particularly, recent developments have simplified hard-disk drive manufacture while yielding increased track densities, thus promoting increased data storage capabilities at reduced costs.

In a hard-disk drive, rotating high precision aluminum or glass disks are coated on both sides with a special thin film media designed to store information in the form of magnetic patterns. Electromagnetic read/write heads suspended or floating only fractions of micro inches above the disk are used to either record information onto the thin film media, or read information from it.

A read/write head may write information to the disk by creating an electromagnetic field to orient a cluster of magnetic grains, known as a bit, in one direction or the other. To read information, magnetic patterns detected by the read/write head are converted into a series of pulses which are sent to the logic circuits to be converted to binary data and processed by the rest of the system. To increase the capacity of disk drives, manufacturers are continually striving to reduce the size of bits and the grains that comprise the bits.

The ability of individual magnetic grains to be magnetized in one direction or the other, however, poses problems where grains are extremely small. The superparamagnetic effect results when the product of a grain's volume (V) and its anisotropy energy ($K_u$) fall below a certain value such that the magnetization of that grain may flip spontaneously due to thermal excitations. Where this occurs, data stored on the disk is corrupted. Thus, while it is desirable to make smaller grains to support higher density recording with less noise, grain miniaturization is inherently limited by the superparamagnetic effect.

In response to this problem, engineers have developed patterned media, where the magnetic thin film layer is created as an ordered array of highly uniform islands, each island capable of storing an individual bit. Each bit may be one grain, or several exchange coupled grains, rather than a collection of random decoupled grains. In this manner, patterned media effectively reduces noise by imposing sharp magnetic transitions at well-defined pre-patterned positions, known as bit patterns. Bit patterns are organized as concentric data tracks around a disk.

A head-positioning servomechanism facilitates the ability of a read/write head to locate a particular data track location and to reposition the head from one location to another. Indexing marks and alignment indices maybe recorded in arc-shaped regions of the disk surface, known as servo sectors, and referenced by the servomechanism to maintain proper dynamic positioning capabilities of the read/write head over time. Track addresses, synchronization signals, and position error signal ("PES") bursts may also be recorded in servo sectors.

While recent developments in hard-disk drive manufacture have facilitated generation of patterned media having increased track densities, servo pattern fabrication considerations have been largely ignored. Servo patterns must therefore be fabricated in a separate process that is generally time-consuming, labor-intensive, and costly.

The recently developed shadow mask approach to hard disk-drive manufacture, for example, is used to increase the density of data islands beyond the capability of e-beam lithography. This approach creates multiple features for each feature on the shadow mask, where each feature on the substrate has a predetermined position offset relative to the corresponding shadow mask feature. Despite the data island production efficiencies accomplished with the shadow mask approach, however, the shadow mask inherently constrains the nature of patterns that can be created on the substrate. Servo patterns thus have been generated using a separate process that is time-consuming, labor-intensive and costly.

Accordingly, a need exists for a practical, attainable apparatus, system, and method for utilizing a shadow mask to form servo patterns on high density patterned media. Beneficially, such an apparatus, system and method would cooperate with the shadow mask approach to track or bit pattern fabrication to produce servo patterns and a high density track or bit pattern substantially simultaneously to reduce costs, labor and resources traditionally associated with patterned media fabrication. Such apparatuses, systems and methods are disclosed and claimed herein.

SUMMARY OF THE INVENTION

The present invention has been developed in response to the present state of the art, and in particular, in response to the problems and needs in the art that have not yet been fully solved by currently available apparatus, methods and systems for utilizing a shadow mask approach to fabricate servo patterns in high density patterned media. Accordingly, the present invention has been developed to provide an apparatus, system, and method for utilizing a shadow mask approach to fabricate servo patterns in high density patterned media that overcome many or all of the above-discussed shortcomings in the art.

The apparatus utilizing a shadow mask approach to fabricate servo patterns in high density patterned media in accordance with certain embodiments of the present invention is provided with a deposition mask and a plurality of deposition sources adapted to deposit material at various angles through the deposition mask. The deposition mask includes a plurality of apertures adapted to direct the material to a plurality of deposition locations on a substrate, where the deposition locations form a servo pattern along an actuator path. As the material is deposited at various angles through the apertures, each aperture corresponds to more than one deposition location.

In certain embodiments, the apparatus includes a plurality of apertures arranged to form an Automatic Gain Control ("AGC") pattern. A first aperture may form a servo feature substantially centered over a data track, while a second aperture may form a second servo feature substantially adjacent the first servo feature and offset therefrom by about one-fourth of an inter-track spacing. Similarly, a third aperture may form a third servo feature substantially adjacent the second servo feature and offset from the first servo feature by about one-half of the inter-track spacing. Finally, a fourth aperture may form a fourth servo feature substantially adjacent the third servo feature and offset from the first servo feature by about three-quarters of the inter-track spacing.

In other embodiments, the apparatus includes a plurality of apertures arranged in rectangular arrays in four regions to form a quadrature burst pattern. In one embodiment, a first aperture may form a first servo feature substantially centered over a data track and a second aperture may form a second servo feature substantially adjacent the first servo feature and offset therefrom by about a full inter-track spacing. Similarly, a third aperture may form a third servo feature substantially adjacent the second servo feature and offset from the second servo feature by about one-half of the inter-track spacing, while a fourth aperture may form a fourth servo feature substantially adjacent the third servo feature and offset from the third servo feature by about one full inter-track spacing.

The apparatus, in one embodiment, provides that each of the plurality of apertures comprises dimensions substantially greater than each of the plurality of deposition locations. In this manner, the multiple deposition locations corresponding to a particular aperture may combine to form a single servo pattern feature. Further, each of the plurality of apertures may be dimensionally biased according to its radial position such that the fixed orientation of the deposition sources does not distort intended characteristics of a servo pattern feature.

The apparatus, in one embodiment, further includes a shield proximate the deposition mask to constrain a variance in deposition angle of the material as it streams from a deposition source. The shield may include a substantially radial aperture corresponding to a substantially narrow surface area of the substrate and deposition mask. In some embodiments, a rotational element may rotate the substrate as material is deposited through the shield onto the substrate. In this manner, deposition locations, including servo pattern features, may be provided on an area of the substrate larger than the area exposed by the shield aperture.

A system of the present invention is also presented that utilizes a shadow mask approach to fabricate servo patterns on high density patterned media. The system may be embodied by a plurality of deposition sources, a deposition mask coupled to a substrate, and a shield element disposed between the deposition sources and the deposition mask. The plurality of deposition sources may be adapted to deposit material through apertures in the deposition mask from various deposition angles. Apertures in the deposition mask may be adapted to direct the material to various deposition locations on the substrate to form a servo pattern. The shield element may constrain a variance in deposition angle of the material. In some embodiments, each of the plurality of apertures is dimensionally biased according to its radial position to ensure dimensional integrity of a resulting deposition location and servo pattern feature.

A method of the present invention is also presented that utilizes a shadow mask approach to fabricate servo patterns on high density patterned media. The method in the disclosed embodiments substantially includes steps to carry out the functions presented above with respect to the operation of the described apparatus and system. In one embodiment, the method includes providing a deposition mask, integrating into the deposition mask a plurality of apertures, and directionally depositing the deposition material at various deposition angles through each of the plurality of apertures to form a servo pattern on the substrate. The method may also include forming each of the plurality of apertures using dimensions substantially greater than each of the plurality of deposition locations, and dimensionally biasing each of the apertures according to its radial position. In some embodiments, directionally depositing the deposition material includes cooperatively depositing the material from various deposition angles to form a single servo pattern feature. In a further embodiment, the method includes rotating the substrate during deposition and constraining a variance in deposition angles of the deposition material. To this end, the method may include providing a shield substantially adjacent the deposition mask and radially disposing within the shield a substantially narrow aperture corresponding to a portion of the substrate to constrain a variance in deposition angles during deposition.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are disclosed to provide a thorough understanding of embodiments of the present invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

As used in this specification, the term "patterned media imprint master" refers to a substrate having reproducible topographic features. In some embodiments, positive replication of such topographic features may be accomplished according to a two generation nanoimprint replication process, where multiple daughter stampers are replicated from the imprint master, and multiple patterned media disks are reproduced from each daughter stamper. As used in this specification, the term "servo pattern" refers to any pattern of topographical features capable of communicating position and address for a sector of a readable patterned media either digitally or through analog signals.

Figure 1:
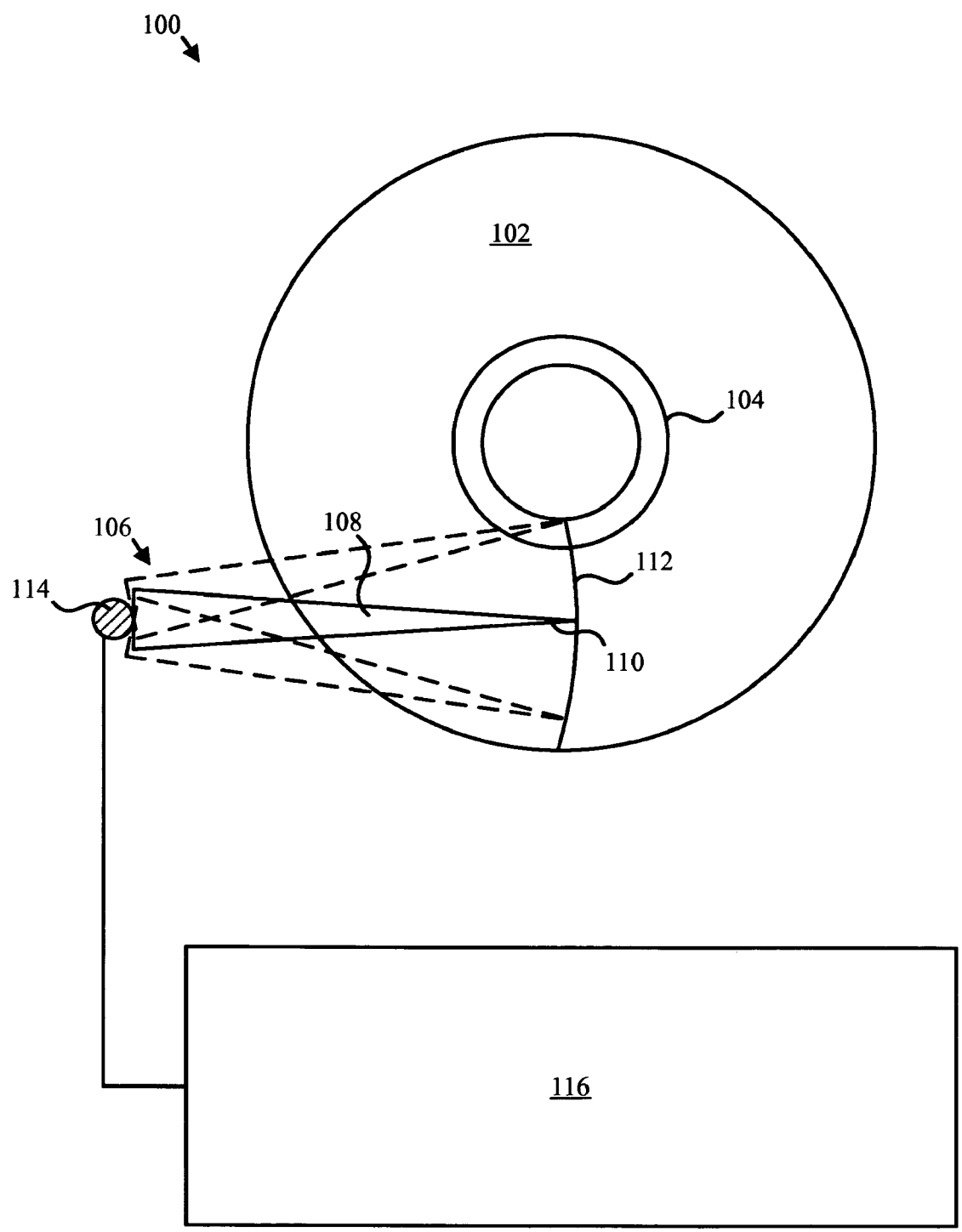
FIG. 1 is a top view of a hard-disk drive depicting a typical servo sector and actuator path.

Referring now to FIG. 1, a diagram of a conventional hard-disk drive assembly 100 is shown. A hard-disk drive assembly 100 generally comprises a plurality of hard disks 102, rotated at high speeds by a spindle motor (not shown) during operation. Concentric data tracks 104 formed on either or both disk surfaces receive and store magnetic information.

A read/write head 110 may be moved across the disk surface by an actuator assembly 106, allowing the head 110 to read or write magnetic data to a particular track 104. The actuator assembly 106 may pivot on a pivot 114. The actuator assembly 106 may form part of a closed loop feedback system, known as servo control, which dynamically positions the read/write head 110 to compensate for thermal expansion of the disks 102 as well as vibrations and other disturbances. Also involved in the servo control system is a complex computational algorithm executed by a microprocessor, digital signal processor, or analog signal processor 116 that receives data address information from an associated computer, converts it to a location on a disk 102, and moves the read/write head 110 accordingly.

Specifically, read/write heads 110 periodically reference servo patterns recorded on the disk to ensure accurate head 110 positioning. Servo patterns may be used to ensure a read/write head 110 follows a particular track accurately, and to control and monitor transition of the head 110 from one track 104 to another. Upon referencing a servo pattern, the read/write head 110 obtains head position information that enables the control circuitry 116 to subsequently re-align the head 110 to correct any detected error.

Servo patterns may be contained in engineered servo sectors 112 embedded within a plurality of data tracks 104 to allow frequent sampling of the servo patterns for optimum disk drive performance. In a typical hard disk 102, embedded servo sectors 112 extend substantially radially from the disk 102 center, like spokes from the center of a wheel. Unlike spokes however, servo sectors 112 form a subtly arc-shaped path calibrated to substantially match the range of motion of the read/write head 110.

Figure 2:
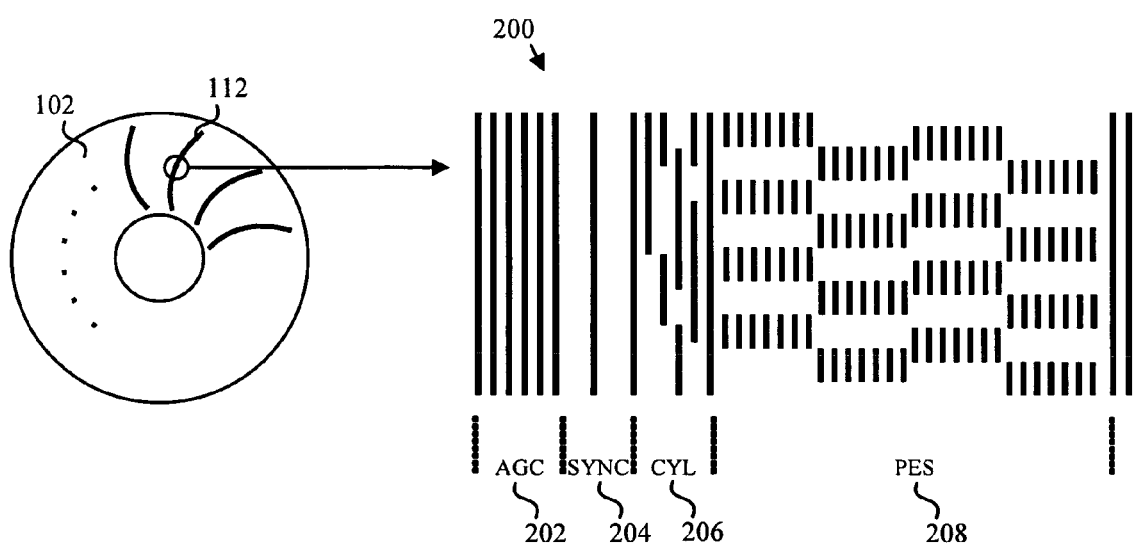
FIG. 2 is a top view of a disk illustrating exemplary servo patterns written on a servo sector.

Referring now to FIG. 2, a servo sector 112 may contain any of various servo patterns 200 known to those in the art. As discussed in more detail with reference to FIGS. 10-13 below, servo patterns may be generally categorized according to their function. Those of skill in the art will recognize that various servo patterns may be used. In FIG. 2, the servo pattern comprises a series of different patterns that can be used to form one or more servo patterns. Automatic gain control patterns ("AGC") 202, for example, provide information used for calculating the amplitude of the servo signal required to adjust the gain in the control circuitry 116. Similarly, synchronization information patterns ("SYNC") 204 provide data timing information, cylinder information patterns ("CYL") 206 provide data track number information, and position error signal patterns ("PES") 208 provide fine track position information. The servo sector 112 depicted by FIG. 2 is an exemplary embodiment illustrating a common servo pattern known to those in the art.

Although servo patterns 200 contained within a servo sector 112 are generally substantially linear, a servo sector 112 may curve to follow the path of the actuator assembly 106 and associated read/write head 110. Since the patterns in a conventional disk drive 100 are written by the product head 110 in the drive, they show the effects of the actual mechanical skew angle of the head 110 imposed by the rotary actuator system, which in turn appears as curvature of the servo sector 112. An angle between the direction of the relative motion of the head 110 with respect to the disk 102 and a radial direction is known as head skew. Head skew ("$\phi$") is related to radial position by the equation $\phi=90°-a\cos((Dpa^2+r^2-Dpc^2)/(2\cdot Dpa\cdot r))$, where Dpa=pivot to actuator assembly length, Dpc=pivot to disk center, and r=radius. Accordingly, head skew is 0 when radial position is equal to approximately half the radial length. As discussed in more detail with reference to FIG. 8 below, certain embodiments of the present invention utilize head skew calculations to ensure accuracy in geometric positioning of servo pattern features.

Figure 3:
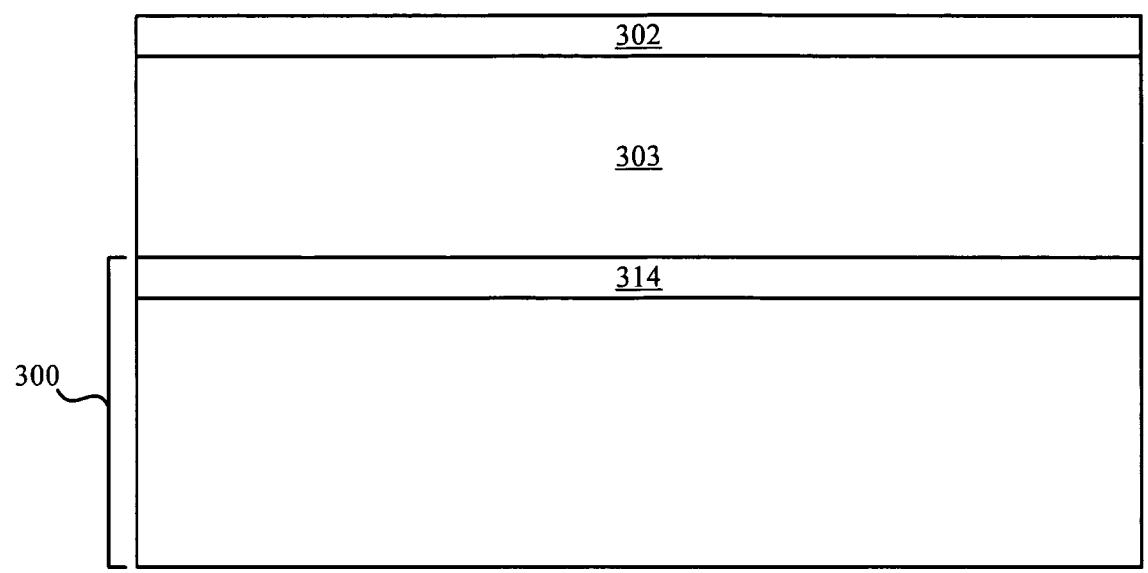
FIG. 3 is a cross-sectional view of one embodiment of an apparatus for fabricating servo patterns on a patterned media in accordance with the present invention.
Figure 4:
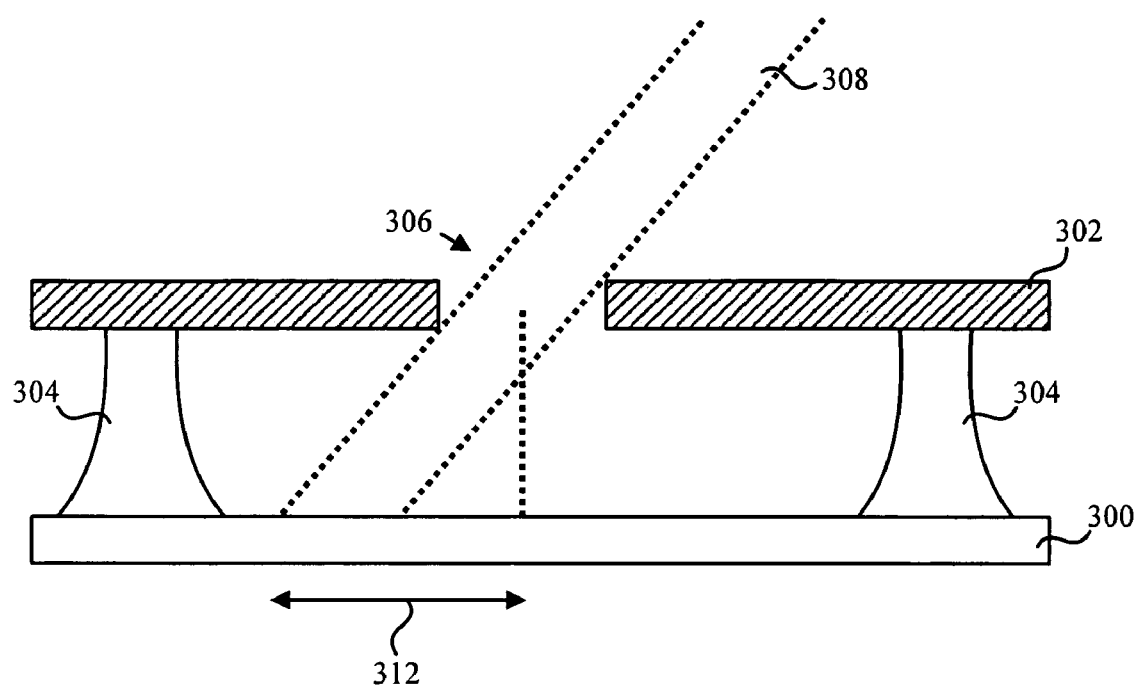
FIG. 4 is a cross-sectional view of an alternative embodiment of an apparatus for fabricating servo patterns in accordance with the present invention.

Referring now to FIGS. 3 and 4, an apparatus for fabricating servo patterns on a high density patterned media in accordance with the present invention may comprise a substrate 300 having a substantially rigid body with a flat surface large enough to contain a master pattern for the full disk surface. The substrate 300 may comprise, for example, a silicon wafer, or a disk substrate made of aluminum-magnesium alloy, glass, ceramic, or any other material known to those in the art. Since e-beam lithography may be performed on the surface of the substrate 300, the substrate 300 may include a conducting material such as doped silicon or metal, or be coated with a suitable conducting layer.

In some embodiments, as shown in FIG. 3, a substrate 300 may be integral to a layered disk from which a deposition mask 302 and spacing elements 304 are formed. A substrate 300 may include a substantially smooth etchable ground layer 314 having a chemistry capable of using deposited material as an etch mask. The ground layer 314 may further comprise a material able to withstand an etch process to which an overlying intermediate layer 303 is subjected. A ground layer 314 may comprise, for example, silicon nitride or other material known to those in the art. Alternatively, a substrate 300 itself may comprise a material such as silicon that is substantially smooth, etchable, and able to withstand an etch process to which an intermediate layer 303 is subjected.

An intermediate layer 303 may generally comprise a substantially rigid material that is both smooth and etchable, such as silicon or other similar material known to those in the art. An intermediate layer 303 may be susceptible to a gas phase etch process using an etchant such as $XeF_2$, and/or a wet etch process.

In certain embodiments, as shown in FIG. 4, an intermediate layer 303 may be subjected to a gas phase etch process to produce spacing elements 304 capable of fixably attaching the substrate 300 to a deposition mask 302 while maintaining a substantially uniform distance therebetween. Spacing elements 304 may, for example, retain a deposition mask 302 at a height of approximately 1 μm above a surface of a substrate 300. Alternatively, spacing elements 304 maybe coupled to either or both of the substrate 300 and deposition mask 302.

In some embodiments, spacing elements 304 may be strategically placed to maximize usable space on the substrate 300 surface. Indeed, after fabrication, both the deposition mask 302 and the spacing elements 304 must be removed, thereby ordinarily resulting in small unused areas on the surface of the substrate 300. However, close inspection of exemplary embodiments of servo patterns disclosed herein with reference to FIGS. 12 and 13 reveals many "open areas" required by the nature of the patterns themselves. Spacing elements 304 may be implemented between a substrate 300 and deposition mask 302 to correspond to such required open areas to achieve maximum pattern efficiency.

A deposition mask 302 may comprise a substantially rigid material capable of maintaining a substantially parallel relationship relative to the substrate 300 while supported by the spacing elements 304. In certain embodiments, a deposition mask 302 may comprise a material capable of acting as an etch mask to the intermediate layer 303 such that the intermediate layer 303 may be subjected to an etch process to form the spacing elements 304. A deposition mask 302 may comprise, for example, silicon nitride, silicon dioxide, carbon, or any other such material known to those in the art.

Referring now to FIG. 4, apertures 306 may be formed in the deposition mask 302 to allow material, ions, electrons, light and/or gas to pass through the deposition mask 302 to the intermediate layer 303 and/or substrate 300. Apertures 306 may be formed in the deposition mask 302 by optical or e-beam lithography, an etching process, a combination thereof, or by any other means known to those in the art.

As discussed in more detail with reference to FIGS. 6 and 7 below, deposition material 308 may stream through an aperture 306 at an angle to form a deposition location 310. In certain embodiments, apertures 306 may be formed to include at least one angled sidewall. Angled sidewalls enable a deposition mask 302 to exhibit greater thickness, and thus increased structural integrity, while avoiding interference with deposition material 308 streaming therethrough.

Figure 5:
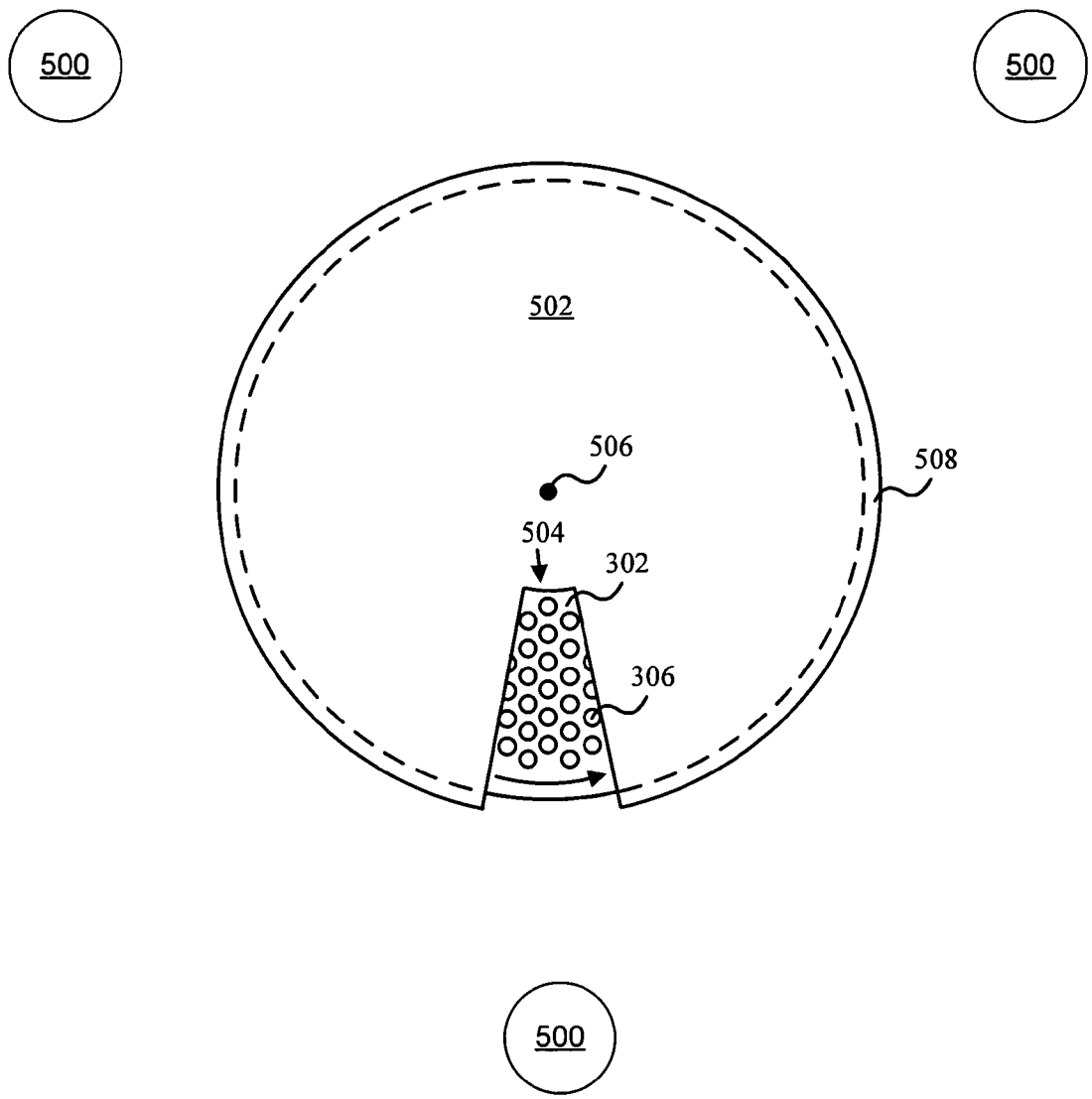
FIG. 5 is a bottom view of one embodiment of a system for fabricating servo patterns on a patterned media in accordance with the present invention.

Referring now to FIG. 5, an apparatus for fabricating servo patterns on a high density patterned media in accordance with the present invention may include deposition sources 500 adapted to deposit deposition material 308 through apertures 306 in the deposition mask 302 by directional physical vapor deposition techniques, such as evaporation, ion beam deposition, or sputtering. A deposition material 308 may include any magnetic material, metal, or other material known to those in the art capable of producing servo patterns. A deposition material 308 may include, for example, chromium, chromium-molybdenum alloy, aluminum, an aluminum alloy or other metal. Alternatively, a deposition material 308 may include a magnetic material or other material known to those in the art. Physical vapor deposition processes transport the deposition material 308 in a vaporized state from a deposition source 500 to the target substrate 300. Vaporized material particles may condense onto the substrate according to a substantially collisionless line-of-sight transport, or may adhere to the substrate 300 as a result of high-energy momentum transfer.

A deposition source 500 in accordance with the present invention may comprise a cathode, a heated crucible, or any other device known to those in the art capable of retaining and projecting a directional stream of material 308 toward a substrate 300. In certain embodiments, a plurality of deposition sources 500 reside at locations distanced from and at oblique angles of incidence to a substrate 300. In certain embodiments, deposition sources 500 are separated from the substrate 300 by a distance of at least 40 cm. The specific angles of incidence corresponding to each deposition source 500 maybe calibrated to direct a stream of material 308 to specific locations on the substrate 300, each location defined in part by an aperture 306 in the deposition mask 302. In this manner, the deposition sources 500 and apertures 306 in the deposition mask 302 cooperate to direct material 308 to particular substrate 300 deposition locations 310 such that the resulting number of locations 310 is a multiple of the number of apertures 306.

In certain embodiments, a system for fabricating servo patterns on high density patterned media in accordance with the present invention includes a shield 502 to facilitate effective and accurate deposition of material at specific deposition locations 310. For a given deposition angle, the shield 502 may be held in a fixed position relative to the deposition source 500 and the surface plane of the substrate 300. The purpose of the shield 502 is to restrict the range of deposition angle of deposition material 308 as it streams through apertures 306 in the deposition mask 302.

In some embodiments, the substrate 300 may be rotated and/or translated relative to the fixed shield 502 to provide a means of depositing material over a larger substrate area than the size of a radial aperture 504 disposed in the shield 502, as discussed in more detail below. A shield 502 may comprise a substantially rigid disk having dimensions at least slightly greater than dimensions corresponding to a substrate 300 such that the shield 502 may substantially cover an entire surface area of the substrate 300 when aligned therewith.

The shield 502 may include at least one radial aperture 504 disposed therein. The aperture 504 may function to isolate a portion of the substrate 300 retained proximate, and in some embodiments substantially aligned with, the shield 502. The radial aperture 504 may extend radially from a center 506 of the shield 502 to its perimeter 508, or may occupy any portion thereof. The dimensions of the radial aperture 504 may suffice to expose a plurality of deposition mask apertures 306 to deposition material 308 deposited from the deposition sources 500. In some embodiments, a length of the radial aperture 504 may accommodate every deposition mask aperture 306 along a radius of a substrate 300 such that a single rotation of the substrate 300 with respect to the radial aperture 504 effectively exposes an entire surface area of the substrate 300. Those skilled in the art will recognize, however, that more than one rotation of the substrate 300 maybe used to deposit deposition material 308 simultaneously or sequentially on the substrate 300 surface to form servo patterns.

In some embodiments, dimensions of the radial aperture 504 may increase in a direction extending from the center 506 to the perimeter 508 in order to equalize the amount of material deposited at different radii on the rotating substrate 300. In certain embodiments, a radial aperture 504 may comprise a shape substantially corresponding to a trapezoid. Of course, those skilled in the art will recognize that an aperture 504 in accordance with the present invention may comprise any shape capable of isolating a portion of a substrate 300 in communication therewith, such as an isosceles triangle, a right triangle, a rectangle, a parallelogram, or any other shape known to those in the art.

Figure 6:
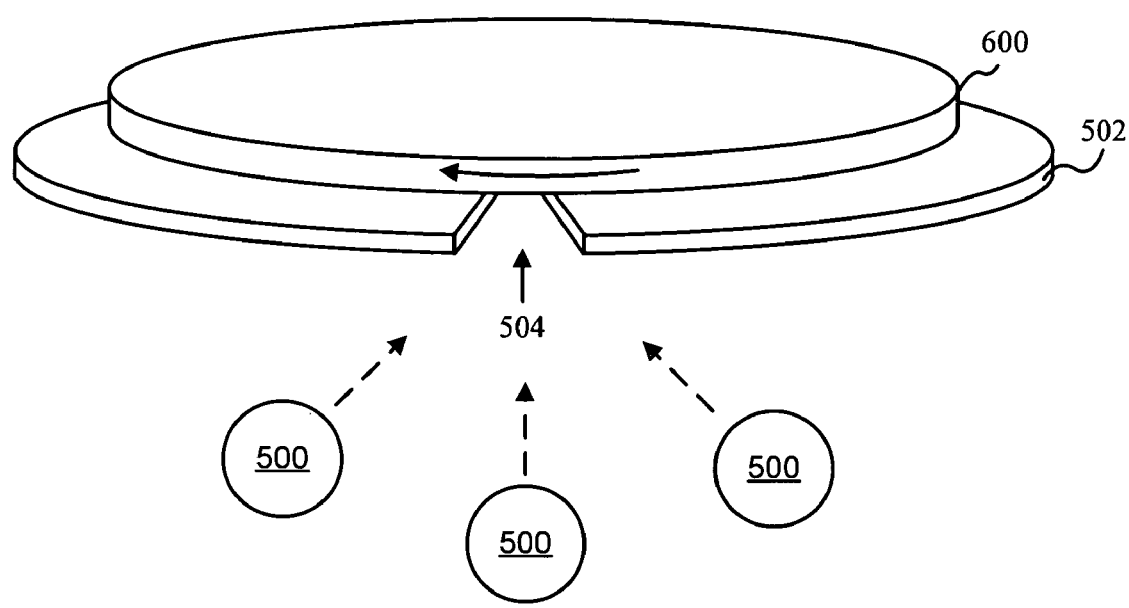
FIG. 6 is a side view of the system of FIG. 4.

Referring now to FIG. 6, a system for fabricating servo patterns on a high density patterned media may include a rotational element 600 comprising a rigid supportive disk capable of rotating with respect to a shield 502. The rotational element 600 may include a spindle (not shown) to substantially center and retain a substrate 300 and deposition mask 302 in accordance with the present invention. In certain embodiments, the rotational element 600 may lie substantially superjacent the shield 502 such that a portion of a substrate 300 disposed on the shield 502 may be exposed through the deposition mask 302 and shield 502 to a stream of deposition material 308 originating from a deposition source 500 below.

Figure 7:
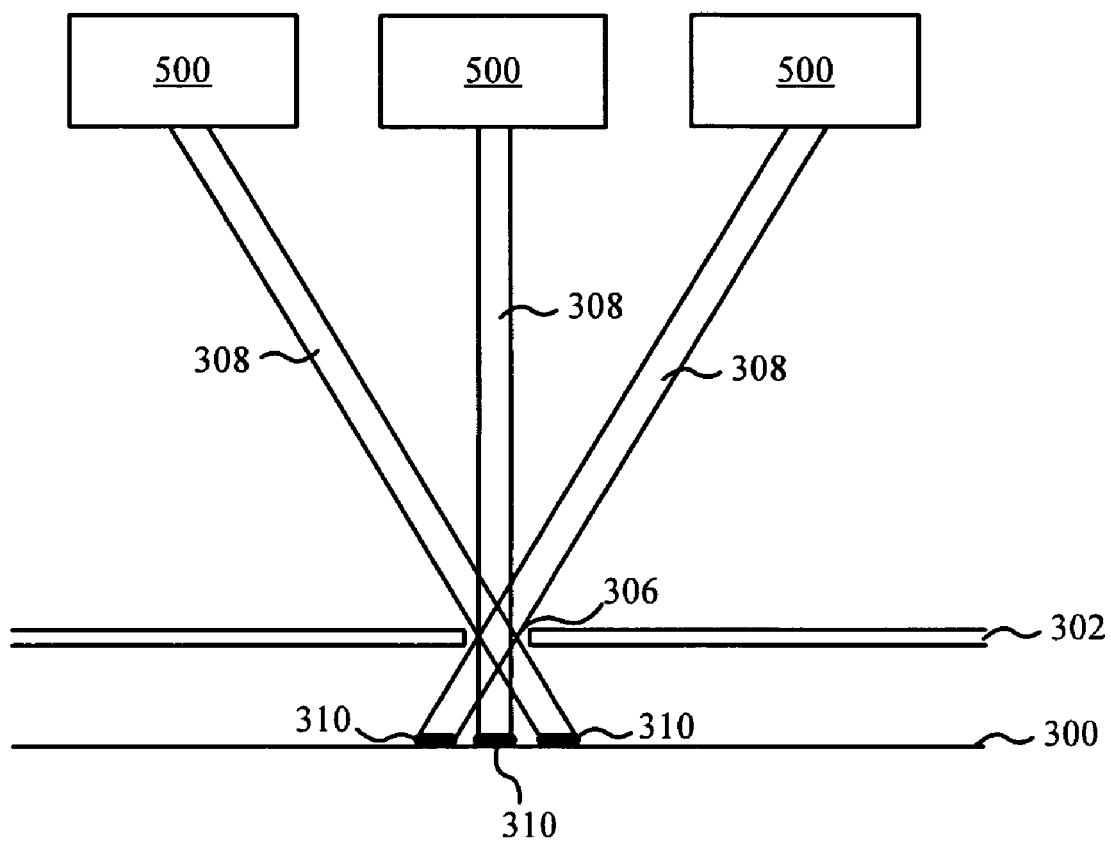
FIG. 7 is a cross-sectional view of the system of FIG. 4.

Referring now to FIG. 7, in certain embodiments, the present invention may be isolated in a vacuum chamber to facilitate effective and accurate deposition at specific substrate deposition locations 310. A vacuum chamber may enable variable deposition conditions, as well as heating and cooling capabilities.

Specifically, as mentioned above with reference to FIG. 3, a deposition source 500 may be implemented to deposit deposition material 308 according to a specific angle of incidence. The specific angle of incidence at which deposition material 308 is deposited cooperates with an aperture 306 in the deposition mask 302 to define a specific deposition location 310. In this manner, several deposition sources 500 may be implemented to deposit deposition material 308 at unique angles of incidence to define more than one deposition location 310 per aperture 306 in the deposition mask 302. In selected embodiments, three deposition sources 500 oriented to deposit deposition material 308 at unique angles of incidence are implemented to define three specific deposition locations 310 for each aperture 306 in the deposition mask 302. A density of deposition locations 310 is thus tripled relative to a density of apertures 306.

Advantageously, the apparatus disclosed above maybe used for servo pattern fabrication as well as data track formation in a single process. However, in certain embodiments certain modifications may be required to create a predictable distribution of topographical features useful for servo control. Particularly, apertures 306 in the deposition mask 302 may require modification to generate a substrate surface pattern having features not directly tied to the number of deposition sources 500 and their angular orientations.

Figure 8A:
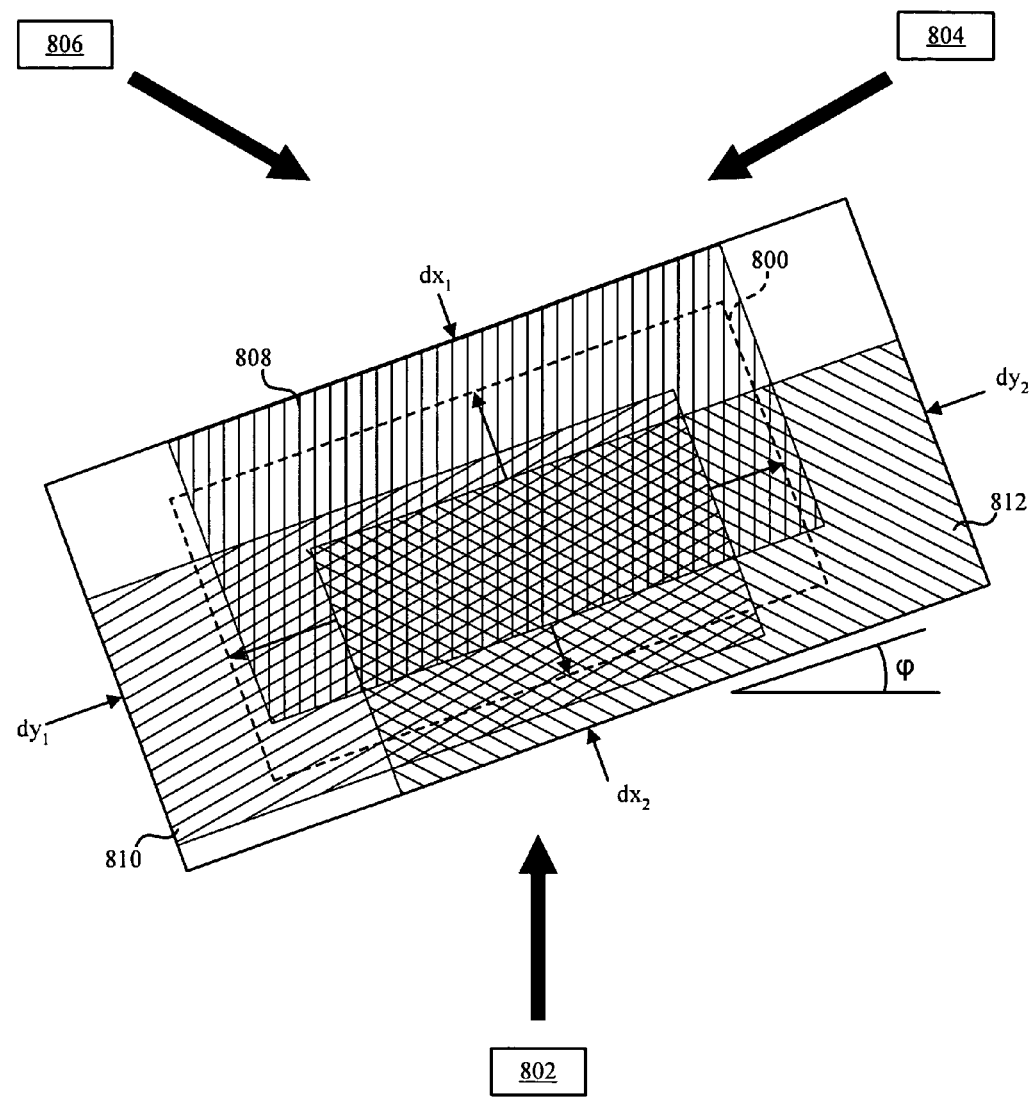
FIG. 8A is a top view of a servo pattern feature resulting from deposition locations formed in accordance with certain embodiments of the present invention.

For example, an enlarged aperture 800 maybe used to create one servo pattern feature instead of multiple features as expected from multiple sources 500 of deposition. Referring now to FIG. 8A, in certain embodiments, a substantially rectangular aperture 800 having increased dimensions relative to the standard apertures 306 used to form data tracks 104 (and/or bit patterns) may be used to generate a single servo pattern feature. One skilled in the art will recognize, however, that an enlarged aperture 800 in accordance with the present invention is not limited to a rectangular shape and may comprise, for example, an oval, a parallelogram, a trapezoid, a circle, a square, a triangle, or any other shape known to those in the art.

In one embodiment, a first deposition source 802 is oriented at 0°, a second deposition source 804 is oriented at 120°, and a third deposition source 806 is oriented at 240°. In this manner, the first deposition source 802 may produce a first deposition location 808, the second deposition source 804 may produce a second deposition location 810, and the third deposition source 806 may produce a third deposition location 812, where each of the three deposition locations 808, 810 and 812 combine to form a single servo pattern feature having broadened dimensions relative to the aperture 800.

Figure 9:
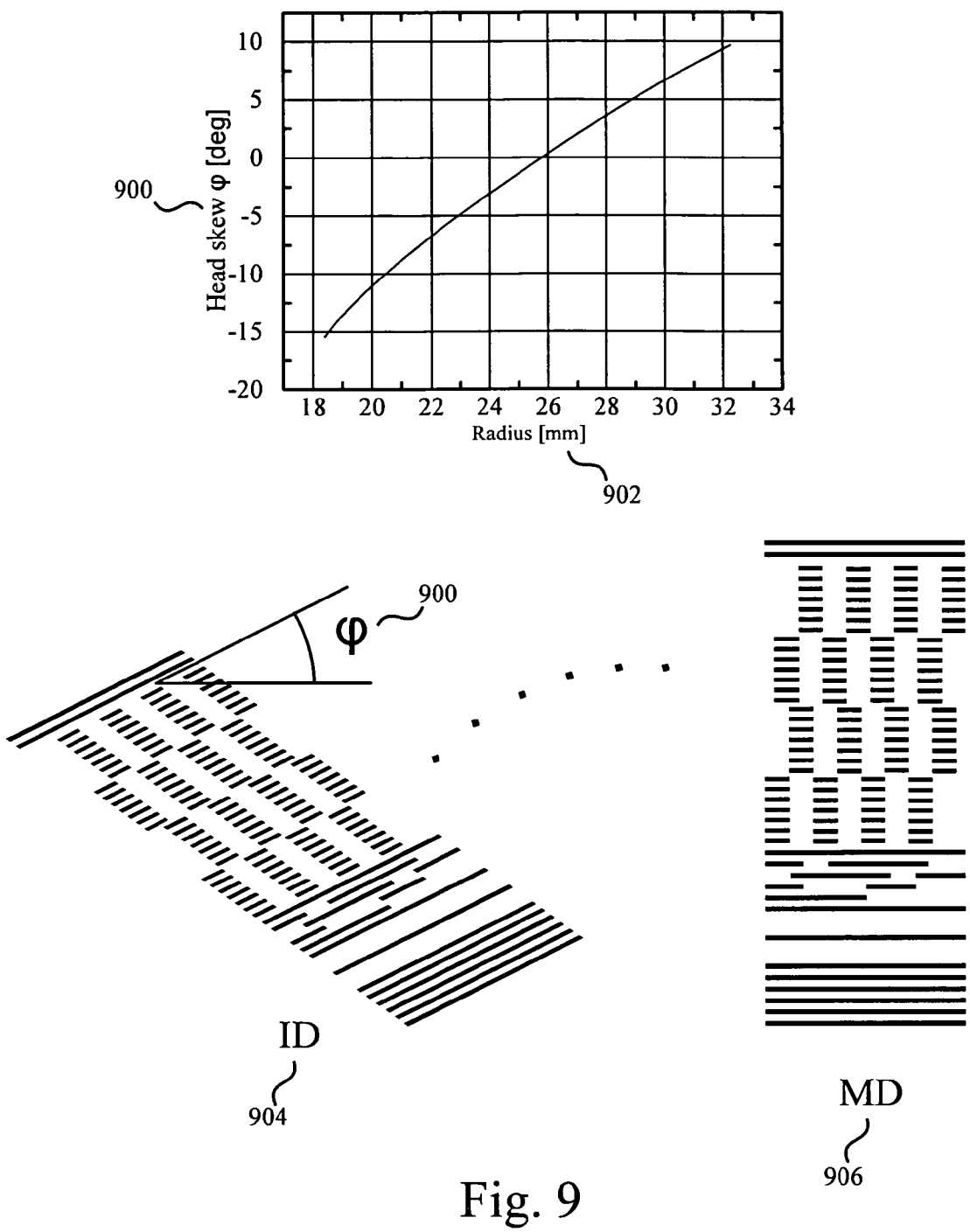
FIG. 9 is a comparative graph of head skew relative to radius of a substrate.

Quantitative values for the broadened features depend on head skew as follows. Distortion in a first direction "$dx_1$" corresponding to the first deposition location 808 is given by $dx_1 = a/3^{1/2} \cos(\phi)$; distortion in a second direction "$dx_2$" corresponding to the second deposition location 812 is given by $dx_2 = a/3^{1/2} \sin(30+|\phi|)$; distortion in a third direction "$dy_1$," corresponding to the third deposition location 810 is given by $dy_1 = a/3^{1/2} \sin(60+\phi)$; and distortion in a fourth direction "$dy_2$" corresponding to the second deposition location 812 is given by $dy_2 = a/3^{1/2} \sin(60-\phi)$, where "a" is the lateral distance between centers of the deposition locations 808, 810 and 812, and φ is head skew. As mentioned above with reference to FIG. 2, and as depicted by FIG. 9, head skew 900 is related to radial position 902 of an aperture 306 by the equation $\phi=90°-a\cos((Dpa^2+r^2-Dpc^2)/(2\cdot Dpa\cdot r))$, where Dpa=pivot to actuator assembly length, Dpc=pivot to disk center, and r=radius. Accordingly, head skew is greater near an inner diameter 904 of a substrate 300 than at mid-diameter 906.

Figure 8B:
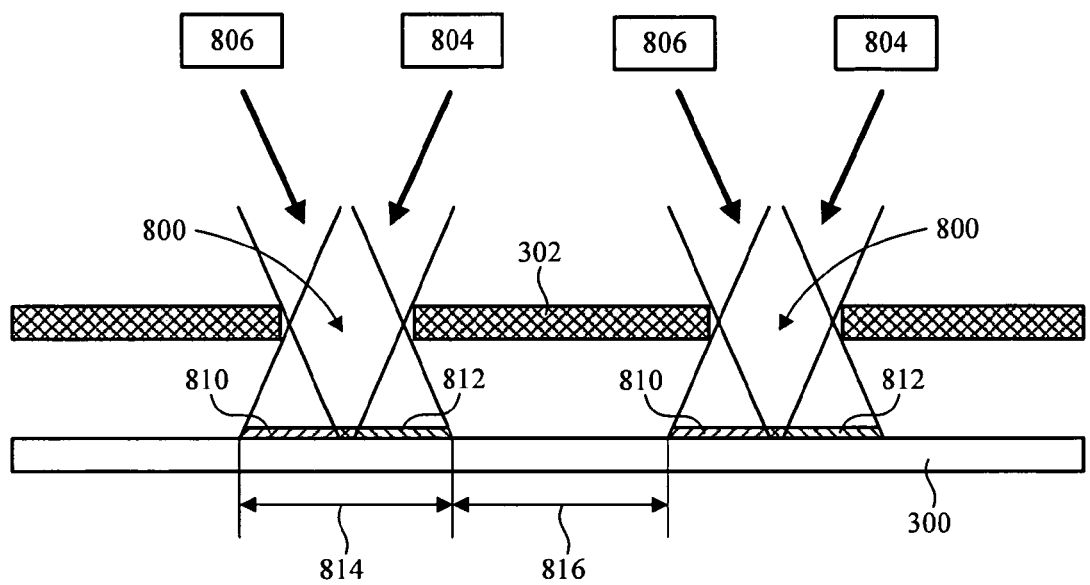
FIG. 8B is a cross-sectional view of one embodiment of a system used to fabricate the servo pattern feature of FIG. 8A.

Quantitative values for broadening as set forth above may be taken into account during deposition mask 302 fabrication to ensure correspondence between aperture 800 dimensions and a resulting servo pattern feature. Specifically, dimensions of an enlarged aperture 800 may be biased according to the aperture's 800 radial position, such that resulting deposition locations 808, 810 and 812 combine to form a single servo pattern feature having regular, anticipated dimensions. In addition, appropriate dimensional biasing of enlarged apertures 800 enables equispacing between adjacent servo pattern features. A width 814 of each resulting servo pattern feature, for example, may equal a space 816 between adjacent servo pattern features, as shown in FIG. 8B. In this manner, enlarged apertures 800 may be implemented to create a predictable, geometrically accurate topographical pattern useful for servo control.

In other embodiments, as illustrated in FIGS. 10-14, apertures 306 intended for servo pattern feature generation may be substantially identical in size and shape to those apertures 306 intended for data track 104 formation, although distinguishable by cumulative pattern effect. Specifically, where apertures 306 intended for servo pattern feature generation fully utilize the increased density capabilities of multiple deposition sources 500 oriented at unique angles of incidence, such apertures 306 may be cumulatively organized to form servo patterns that integrate multiple deposition locations 310 to form a single servo pattern feature.

Figure 10:
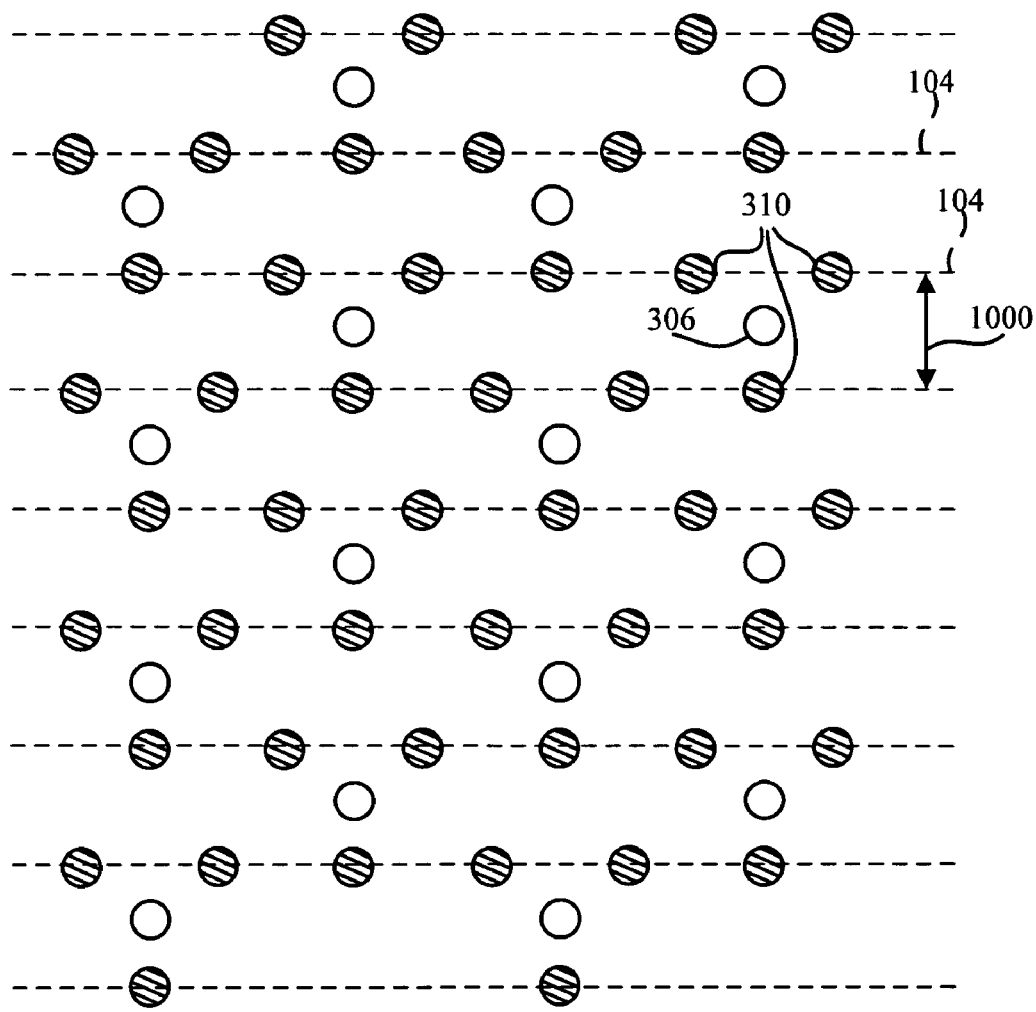
FIG. 10 is a plan view of deposition locations forming a bit pattern on a substrate relative to apertures in a deposition mask used to produce the deposition locations in accordance with certain embodiments of the present invention.
Figure 11:
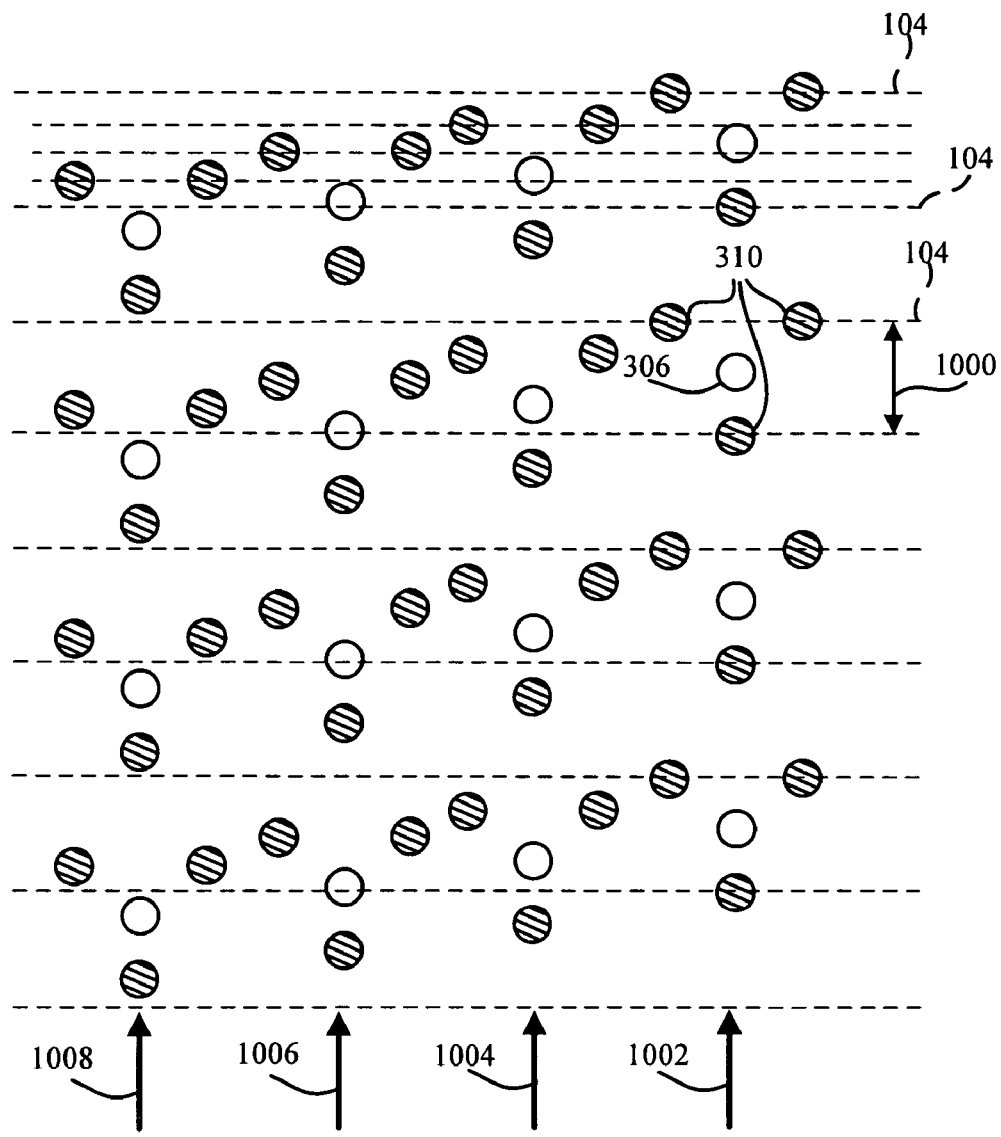
FIG. 11 is a plan view of deposition locations forming a servo pattern on a substrate relative to apertures in a deposition mask used to produce the deposition locations in accordance with one embodiment of the present invention.

Referring now to FIGS. 10 and 11, for example, one embodiment of the present invention utilizes multiple apertures 306 arranged to form a data or servo pattern. In FIG. 10, the apertures 306 are spaced so as to form data tracks 104 positioned horizontally and having substantially constant spacing 1000 between tracks 104. In FIG. 11, multiple apertures 306 are arranged to form an AGC type servo pattern. As seen in FIG. 11, certain embodiments of the present invention may provide four groups of apertures 306 mutually shifted by one quarter of the track spacing 1000 to produce an AGC type servo pattern. Specifically, a first group of apertures 1002 produces deposition locations 310 substantially corresponding to the track spacing 1000. A second group of apertures 1004 is shifted by one-quarter of the track spacing 1000 relative to the first group of apertures 1002. A third group of apertures 1006 is shifted by one-half of the track spacing 1000 relative to the first group of apertures 1002. Finally, a fourth group of apertures 1008 is shifted by three-quarters of the track spacing 1000 relative to the first group of apertures 1002. In this way it is ensured that in any pass of the read/write head 110 above the resulting AGC pattern, signals of equal amplitude may be obtained.

Figure 12:
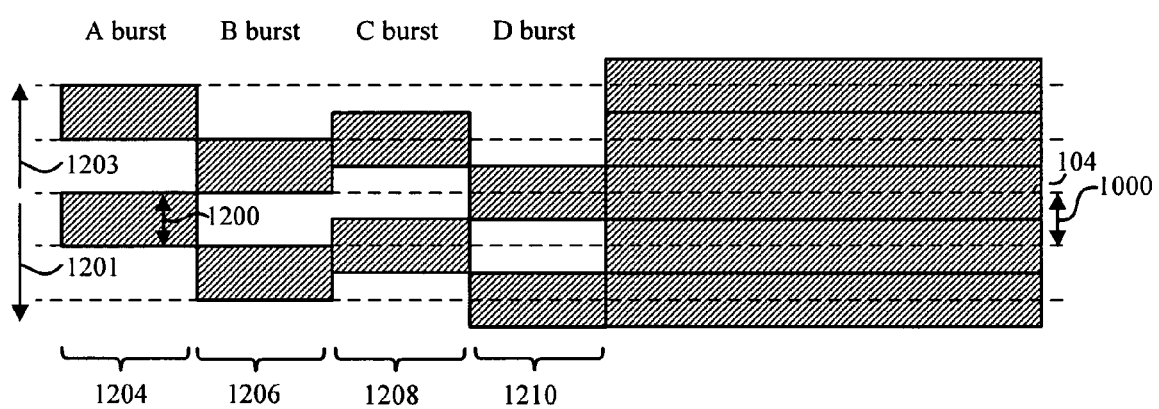
FIG. 12 is a diagram of a conventional quadrature position error signal pattern generated for servo control relative to data tracks on a substrate.
Figure 13:
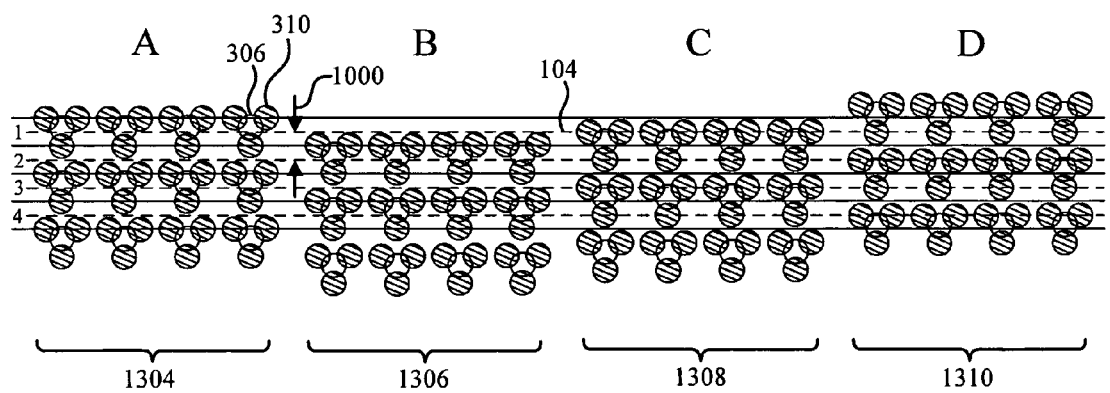
FIG. 13 is a plan view of a quadrature position error signal pattern generated in accordance with certain embodiments of the present invention.

Referring now to FIGS. 12 and 13, a conventional quadrature burst servo pattern may be formed on a substrate 300 by the apparatus, system and method disclosed herein. As shown in FIG. 12, a conventional quadrature burst servo pattern generally consists of four sequential bursts containing periodic features, where the width 1200 of each periodic feature substantially equals the data track spacing 1000. A first burst "A" 1204 includes periodic features shifted one-half of the track spacing 1000 in one direction 1201 from the data track 104; a second burst "B" 1206 includes periodic features shifted one-half of the track spacing 1000 in the other direction 1203 from the data track 104; a third burst "C" 1208 includes periodic features shifted a full track spacing 1000 in the same direction 1201 as the first burst "A" 1204; and a fourth burst "D" 1210 includes periodic features positioned to correspond to the data track 104. By measuring the relative amplitude of each burst 1204, 1206, 1208 and 1210, the servo control system of a disk drive 100 is able to determine the position of the read/write head 110 with respect to the data track 104.

Referring now to FIG. 13, apertures 306 formed in a deposition mask 302 in accordance with the present invention may generate a quadrature burst servo pattern that is substantially similar to the conventional quadrature burst servo pattern of FIG. 12. Specifically, apertures 306 in the deposition mask 302 may be strategically positioned according to the anticipated placement of deposition locations 310 corresponding thereto. For example, where three deposition sources 500 are oriented at 0°, 120° and 240°, respectively, resulting deposition locations 310 are anticipated at a lateral distance of $a/3^{1/2}$ from the aperture 306 position, where "a" is equal to the lateral distance between adjacent deposition locations 310. Aperture 306 locations may be displaced to produce shifts in the resulting deposition locations 310 corresponding to conventional quadrature burst shifts.

Specifically, apertures 306 may be arranged in rectangular arrays in four regions to create cumulative deposition locations 310 corresponding to bursts "A" 1304, "B" 1306, "C" 1308, and "D" 1310. As in the case of the conventional quadrature burst pattern shown in FIG. 12, the position of features in bursts "A" 1304 and "B" 1306 are a full track spacing 1000 apart; likewise features in bursts "C" 1308 and "D" 1310 are a full track spacing 1000 apart. The pair of bursts "C" 1308 and "D" 1310 are shifted by one-half track spacing 1000 relative to the pair of bursts "A" 1304 and "B" 1306. The order of bursts "A" 1304, "B" 1306, "C" 1308 and "D" 1310 depicted by FIGS. 12 and 13 is provided by way of example and not limitation. In alternative embodiments, bursts "A" 1304, "B" 1306, "C" 1308 and "D" 1310 may be arranged in any order known to those in the art.

Figure 14:
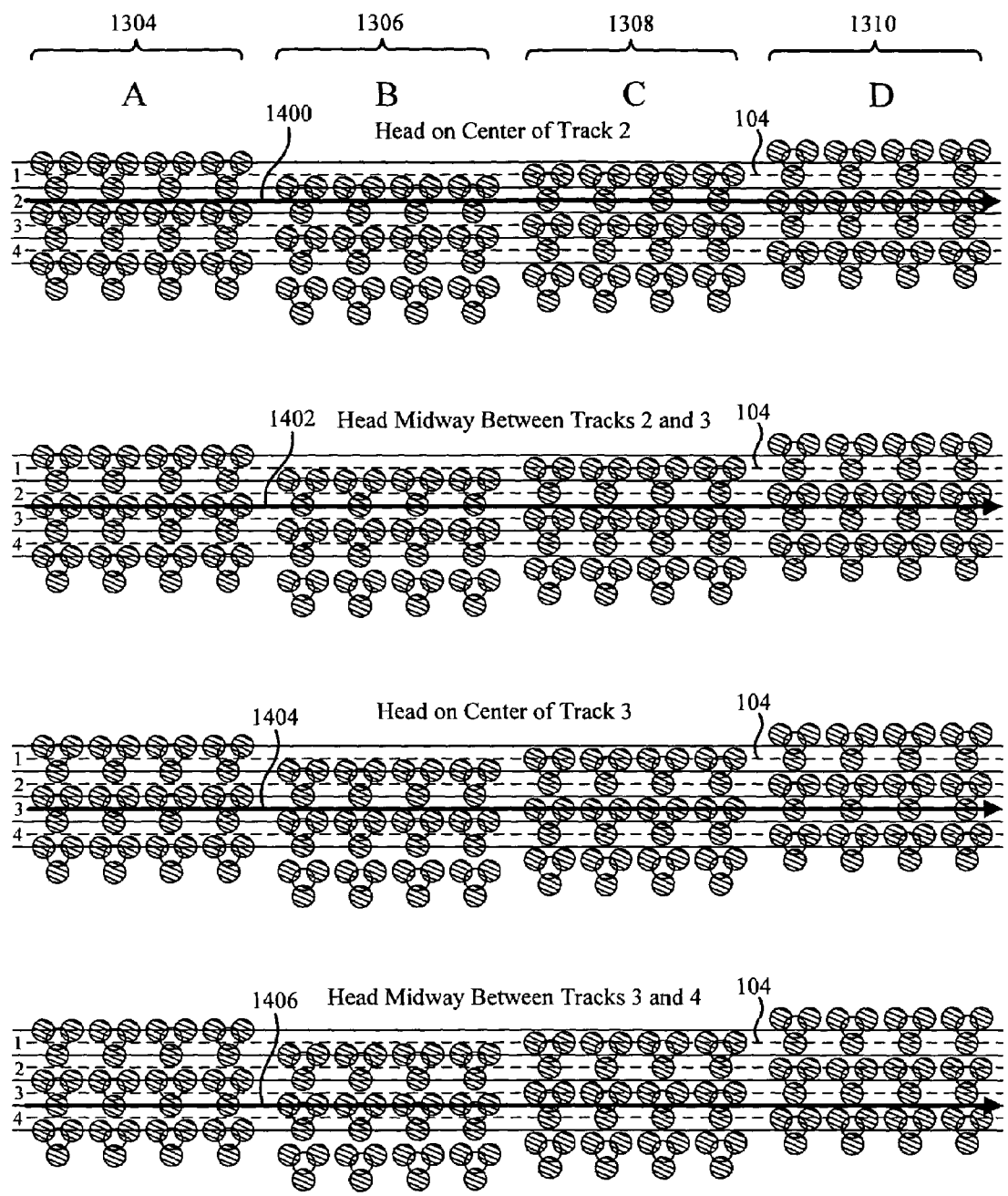
FIG. 14 is a diagram of alternative exemplary positions of a read/write head relative to adjacent data tracks.
Figure 15:
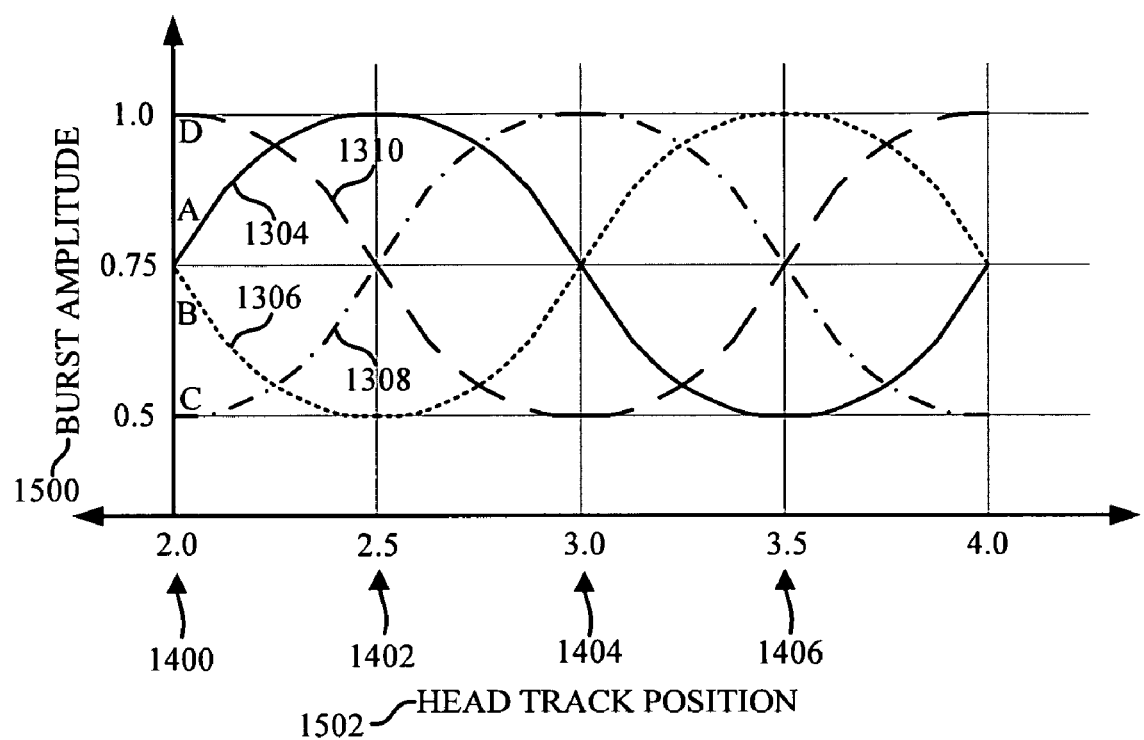
FIG. 15 is a comparative graph depicting the amplitude of the response of the read/write head to each burst of the quadrature position error signal pattern relative to the alternative exemplary read/write head positions depicted by FIG. 14.
Figure 16:
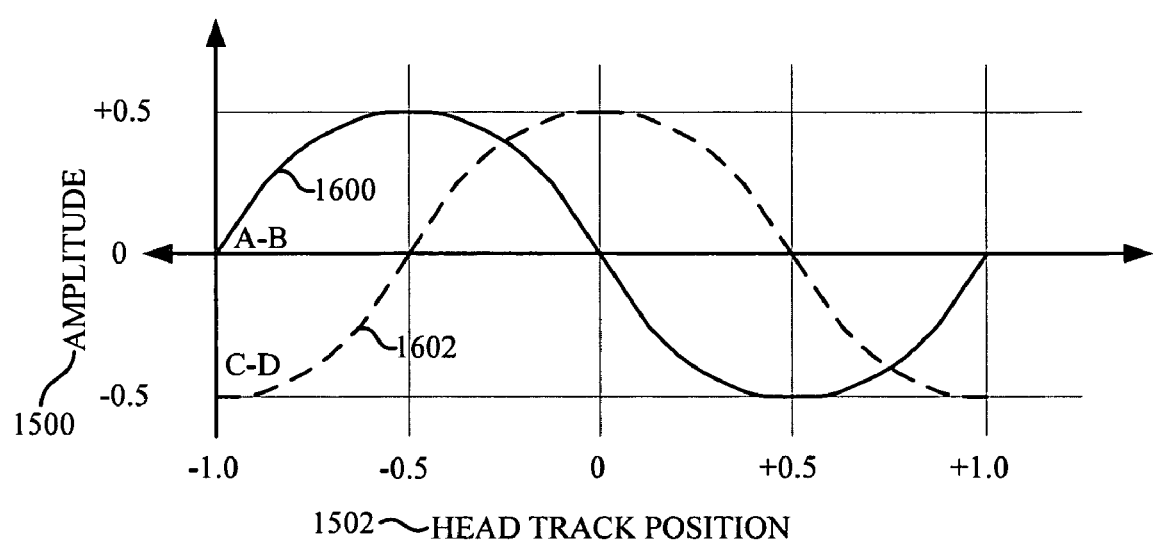
FIG. 16 is a comparative illustrating the signals obtained by computing the amplitude differences between pairs of the bursts of FIG. 15.

The response of the read/write head 110 to servo patterns generated by embodiments of the present invention and the method for determining the lateral head position therefrom can be understood by examining FIGS. 14, 15, and 16. Referring now to FIG. 14, the read/write head 110 may assume a position corresponding to a particular data track 104, or may assume a position between adjacent data tracks 104. The amplitude response of the read/write head 110 varies depending on its lateral position relative to any individual burst 1304, 1306, 1308, 1310 residing on the tracks 104. In the exemplary embodiment depicted by FIG. 14, for example, the head 110 responds with a larger amplitude signal when it follows a path that traverses eight deposition locations 310 corresponding to a particular burst 1304, 1306, 1308 and 1310, than when it follows a path that traverses four deposition locations 310 corresponding to the same burst 1304, 1306, 1308 and 1310. In the same embodiment, the head 110 may reflect an amplitude having a value between the values generated in response to the eight deposition location path and the four deposition location path when the head 110 follows a path between discrete data tracks 104. For example, where the head 110 assumes a position 1402, 1406 midway between tracks, the associated amplitude signal may be between that obtained where the position 1400, 1404 of the head follows either of the adjacent tracks.

FIG. 15 illustrates exemplary values corresponding to signal amplitude values 1500 obtained by the head 110 in response to traversing a particular burst path. These burst amplitude values 1500 may be compared to corresponding exemplary head track positions 1502, such as those head track positions 1400, 1402, 1404 and 1406 illustrated by FIG. 14.

The difference between signal amplitude values obtained in response to adjacent burst pairs generated by embodiments of the present invention may be substantially identical to those obtained in response to a conventional quadrature burst pattern, such as that depicted by FIG. 12. FIG. 16 illustrates exemplary values corresponding to a difference 1600 in signal amplitude values between the burst pair including burst "A" 1304 and burst "B" 1306, where the initial signal amplitude values are derived from those provided by FIG. 15. FIG. 16 further illustrates values corresponding to the difference 1602 in amplitude between the burst pair including burst "C" 1308 and burst "D" 1310.

Figure 17:
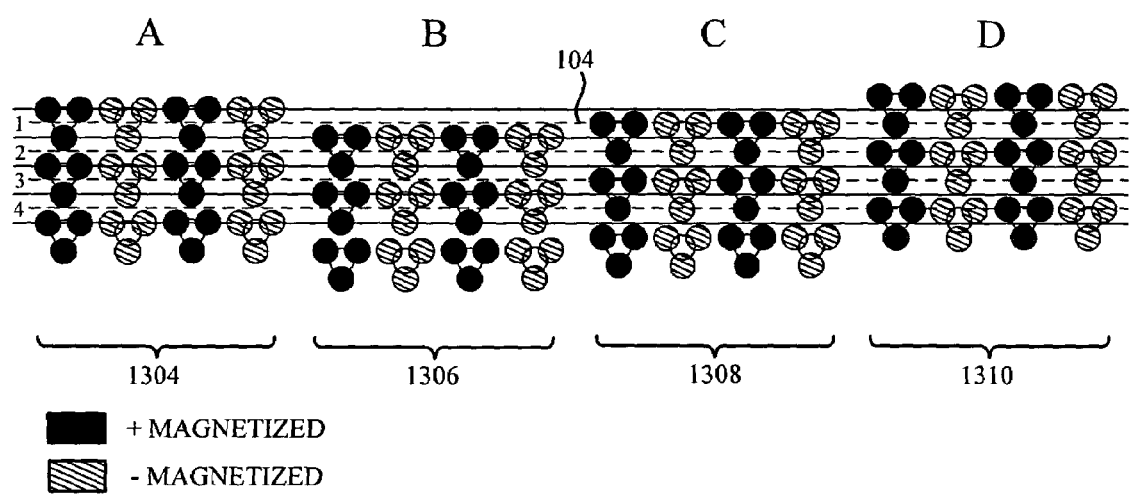
FIG. 17 is a diagram depicting magnetization of certain deposition locations of FIG. 14 in accordance with certain embodiments of the present invention.

Referring now to FIG. 17, servo patterns generated in accordance with embodiments of the present invention may be magnetized according to the method disclosed by U.S. patent application Ser. No. 11/148,918 assigned to Hitachi and incorporated herein in its entirety by reference, or by any other method known to those in the art. In certain embodiments, servo patterns generated in accordance with the present invention may reflect alternating magnetization as depicted by FIG. 17.

As mentioned above with reference to FIG. 3, embodiments of the present invention that utilize enlarged apertures 306 to form servo pattern features, as well as embodiments that fully utilize increased density capabilities of the present invention, may utilize open areas of the substrate 300 separating adjacent servo pattern features to accommodate spacing elements 304 between the substrate 300 and deposition mask 302. In this manner, maximum pattern efficiency may be achieved.

The schematic flow chart diagram that follows is generally set forth as a logical flow chart diagram. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. The order in which a particular method occurs may or may not strictly adhere to the order of the corresponding steps shown.

Figure 18:
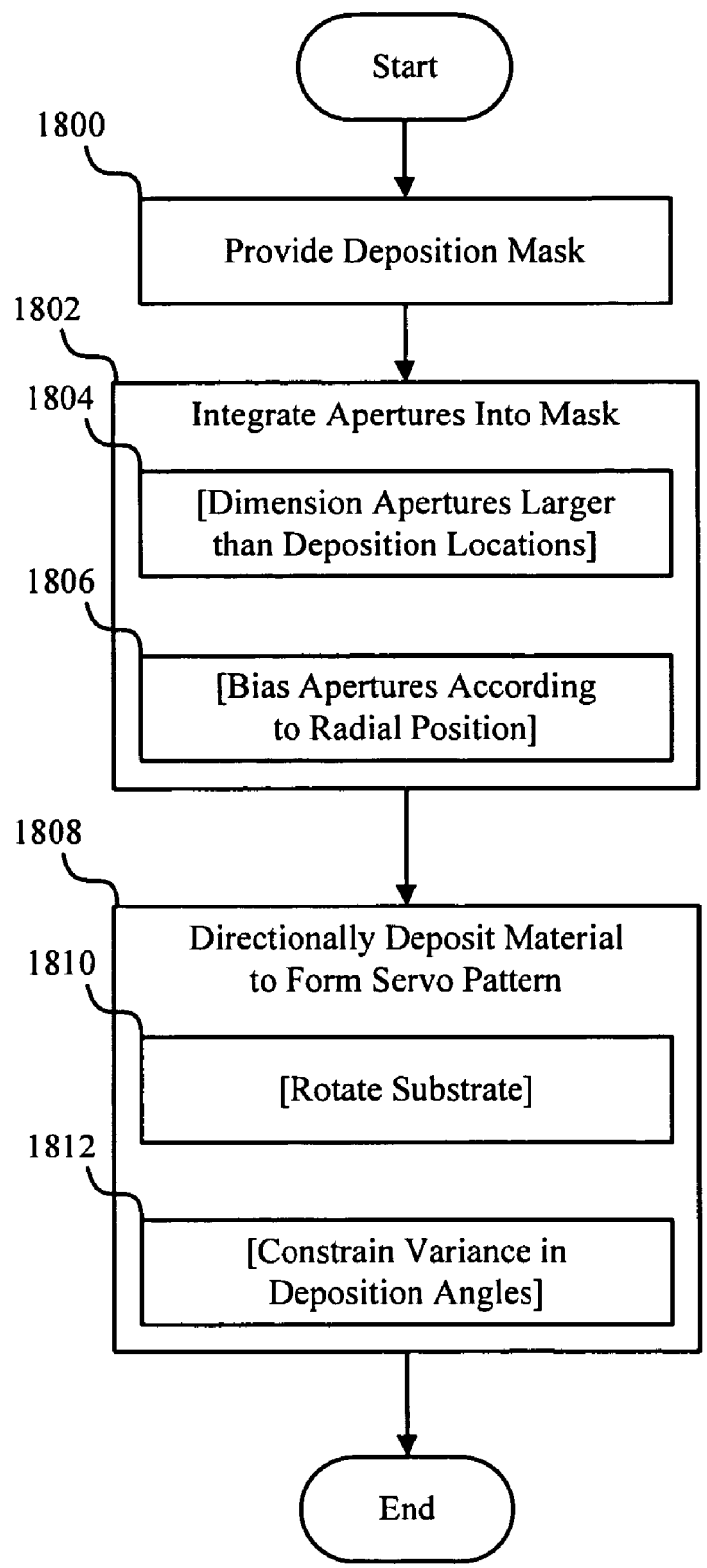
FIG. 18 is a schematic flow chart diagram of a method for utilizing a shadow mask approach to fabricate servo patterns on high density patterned media in accordance with certain embodiments of the present invention.

Referring now to FIG. 18, a method for fabricating servo patterns on high density patterned media in accordance with the present invention may include providing 1800 a deposition mask 302 and integrating 1802 apertures 306 into the mask. Integrating 1802 the apertures 306 may include dimensioning 1804 the apertures 306 larger than anticipated deposition locations such that the deposition locations combine to form a single servo pattern feature. Each aperture 306 may further be biased 1806 according to its radial position to avoid positional distortion and broadening of the resulting servo pattern feature.

Next, a method for fabricating servo patterns on high density patterned media may include directionally depositing 1808 material through the apertures 306 to form a servo pattern on a substrate 300. In certain embodiments, the method may include rotating 1810 the substrate 300 during deposition and constraining 1812 a variance in deposition angles to optimize geometric accuracy of the resulting servo pattern. A shield 502 may be provided substantially adjacent the deposition mask 302 to constrain a variance in deposition angles by limiting deposition to an area of the substrate corresponding to a radial aperture integrated into the shield 502.

In certain embodiments, the substrate 300 may be removed from the deposition mask 302 following deposition to undergo an etch process, which may include performing a plasma etch to transfer the pattern from the deposited material into the substrate. Specifically, the deposited material may be used as an etch mask, with $CF_4$ plasma used to etch a substrate or ground layer of the substrate comprising silicon nitride. Once the method of the present invention is complete, a two-generation nanoimprint replication process may be used to positively replicate the topographic servo pattern, as well as high density topographic data tracks formed substantially simultaneously, from the patterned media onto multiple patterned media disks. In this manner, the present invention effectively reduces costs, labor and resources traditionally associated with patterned media manufacture, and particularly with servo pattern fabrication.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for utilizing a shadow mask approach to fabricate servo patterns and bit patterns on high density patterned media, the apparatus comprising:
   a deposition mask having a plurality of apertures adapted to direct a material to a plurality of deposition locations on a substrate, the deposition locations forming a servo pattern;
   a plurality of bit pattern apertures formed in the deposition mask, the bit pattern apertures adapted to direct a material to a plurality of deposition locations on the substrate, the deposition locations forming a bit pattern; and
   a plurality of deposition sources adapted to deposit the material at various deposition angles through each of the plurality of apertures to form deposition locations for both a bit pattern and a servo pattern during a single deposition process.

2. The apparatus of claim 1, wherein the servo pattern comprises a plurality of servo features, each servo feature comprising a plurality of substantially overlapped deposition locations.

3. The apparatus of claim 2, wherein each of the plurality of apertures is dimensionally biased such that each resulting servo feature is equispaced, the width of the servo feature corresponding to a distance between adjacent servo features.

4. The apparatus of claim 2, wherein the servo pattern comprises an Automatic Gain Control ("AGC") pattern and wherein the plurality of apertures comprises a first aperture forming a first servo feature substantially centered over a data track, and a second aperture forming a second servo feature substantially adjacent the first servo feature and offset from the first servo feature by about one-fourth of an inter-track spacing.

5. The apparatus of claim 4, further comprising a third and a fourth aperture, the third aperture forming a third servo feature substantially adjacent the second servo feature and offset from the first servo feature by about one-half of the inter-track spacing, and the fourth aperture forming a fourth servo feature substantially adjacent the third servo feature and offset from the first servo by about three-quarters of the inter-track spacing.

6. The apparatus of claim 2, wherein the servo pattern comprises a quadrature burst pattern and wherein the plurality of apertures comprises a first aperture forming a first servo feature substantially centered over a data track, and a second aperture forming a second servo feature offset from the first servo feature by about a full inter-track spacing.

7. The apparatus of claim 6, further comprising a third and a fourth aperture, the third aperture forming a third servo feature offset from the second servo feature by about one-half of the inter-track spacing, and the fourth aperture forming a fourth servo feature offset from the third servo feature by about one full inter-track spacing.

8. The apparatus of claim 1, wherein each of the plurality of apertures is positioned on the deposition mask such that the resulting servo pattern corresponds to a conventional servo pattern.

9. The apparatus of claim 1, wherein the apertures are positioned relative to each other on the deposition mask such that areas on the deposition mask having no apertures form open areas that contribute to formation of the servo pattern.

10. The apparatus of claim 1, wherein the at least one deposition source comprises at least one of a heated crucible and a cathode.

11. The apparatus of claim 1, further comprising a plurality of spacing elements interposed between the deposition mask and the substrate, wherein each of the plurality of spacing elements corresponds to an open area of the servo pattern.

12. The apparatus of claim 1, further comprising a shield proximate the deposition mask to constrain a variance in deposition angles of the material from the at least one deposition source.

13. The apparatus of claim 12, wherein the shield comprises a substantially radial aperture corresponding to a substantially narrow portion of the substrate.

14. The apparatus of claim 13, further comprising a rotational element adapted to rotate the substrate during deposition.

15. A method for utilizing a shadow mask approach to fabricate servo patterns on high density patterned media, comprising:
providing a deposition mask;
integrating into the deposition mask a plurality of apertures adapted to direct a deposition material to a plurality of deposition locations on a substrate, the plurality of deposition locations forming a servo pattern and bit pattern on the substrate;
directionally depositing the deposition material from a plurality of deposition sources at various deposition angles through each of the plurality of apertures to form a servo pattern and a bit pattern on the substrate such that deposition material passing through each aperture forms two or more features on the substrate.

16. The method of claim 15, further comprising substantially overlapping a plurality of deposition locations to form a servo feature on the substrate, wherein the servo pattern comprises a plurality of servo features.

17. The method of claim 16, wherein each of the plurality of apertures are dimensionally biased and positioned such that each resulting servo feature is equispaced, the width of the servo feature corresponding to a distance between adjacent servo features.

18. The method of claim 15, wherein each of the plurality of apertures is positioned on the deposition mask such that the resulting servo pattern corresponds to a conventional servo pattern.

19. The method of claim 15, further comprising forming in the deposition mask a plurality of bit pattern apertures adapted to direct a material to a plurality of deposition locations on the substrate, the deposition locations forming a bit pattern.

20. The method of claim 15, further comprising interposing a plurality of spacing elements between the deposition mask and the substrate, each of the plurality of spacing elements corresponding to an open area of the servo pattern.

21. The method of claim 15, wherein directionally depositing the deposition material comprises rotating the substrate during deposition.

22. The method of claim 15, further comprising providing a shield substantially adjacent the deposition mask to constrain a variance in deposition angles.

23. The method of claim 22, wherein providing a shield substantially adjacent the deposition mask further comprises radially disposing within the shield a substantially narrow aperture corresponding to a portion of the substrate.

24. A servo pattern formed by the process of claim 15.

25. A system for utilizing a shadow mask approach to fabricate servo patterns on high density patterned media, comprising:
a plurality of deposition sources adapted to substantially simultaneously deposit material onto a substrate from various deposition angles;
a deposition mask coupled to the substrate, the deposition mask having a plurality of apertures adapted to direct the material to various deposition locations on the substrate, a portion of the deposition locations cooperating to form a servo pattern; and a portion of the deposition locations forming a bit pattern; and
a shield element disposed between the plurality of deposition sources and the deposition mask to constrain a variance in deposition angle of the material.

26. The system of claim 25, wherein the servo pattern comprises a plurality of servo features, each servo feature comprising a plurality of substantially overlapped deposition locations.

27. The system of claim 26, wherein each of the plurality of apertures is dimensionally biased such that each resulting servo feature is equispaced, the width of the servo feature corresponding to a distance between adjacent servo features.

28. The system of claim 25, wherein each of the plurality of apertures is positioned on the deposition mask such that the resulting servo pattern corresponds to a conventional servo pattern.

29. An apparatus for utilizing a shadow mask approach to fabricate servo patterns on high density patterned media, the apparatus comprising:
a deposition mask having a plurality of apertures adapted to direct a material to a plurality of deposition locations on a substrate, the deposition locations forming a servo pattern;
at least one deposition source adapted to deposit the material at various deposition angles through each of the plurality of apertures;
a servo pattern comprising an Automatic Gain Control ("AGC") pattern having a plurality of substantially overlapped deposition locations; and wherein the plurality of apertures comprises a first aperture forming a first servo feature substantially centered over a data track, and a second aperture forming a second servo feature substantially adjacent the first servo feature and offset from the first servo feature by about one-fourth of an inter-track spacing.

30. The apparatus of claim 29, further comprising a third and a fourth aperture, the third aperture forming a third servo feature substantially adjacent the second servo feature and offset form the first servo feature by about one-half of the inter-track spacing, and the fourth aperture forming a fourth servo feature substantially adjacent the third servo feature and offset from the first servo by about three-quarters of the inter-track spacing.

31. An apparatus for utilizing a shadow mask approach to fabricate servo patterns on high density patterned media, the apparatus comprising:
- a deposition mask having a plurality of apertures adapted to direct a material to a plurality of deposition locations on a substrate, the deposition locations forming a servo pattern;
- at least one deposition source adapted to deposit the material at various deposition angles through each of the plurality of apertures;
- a servo pattern comprising a quadrature burst pattern having a plurality of substantially overlapped deposition locations; and
- wherein the plurality of apertures comprises a first aperture forming a first servo feature substantially centered over a data track, and a second aperture forming a second servo feature offset from the first servo feature by about a full inter-track spacing.

32. The apparatus of claim 31, further comprising a third and a fourth aperture, the third aperture forming a third servo feature offset from the second servo feature by about one-half of the inter-track spacing, and the fourth aperture forming a fourth servo feature offset form the third servo feature by about one full inter-track spacing.

* * * * *

UNITED STATES PATENT AND TRADEMARK OFFICE
CERTIFICATE OF CORRECTION

| | |
|---|---|
| PATENT NO. | : 7,236,324 B2 |
| APPLICATION NO. | : 11/252457 |
| DATED | : June 26, 2007 |
| INVENTOR(S) | : Thomas Robert Albrecht et al. |

It is certified that error appears in the above-identified patent and that said Letters Patent is hereby corrected as shown below:

Title page Item [73] Name of Assignee: "Hitachi Global Storage Technologies" should read -- Hitachi Global Storage Technologies Netherlands B.V. --.

Residence (City and State OR Country): "Amsterdam Netherlands B.V." should read -- Amsterdam, The Netherlands --.

Signed and Sealed this

Thirty-first Day of March, 2009

JOHN DOLL
*Acting Director of the United States Patent and Trademark Office*